(12) United States Patent
Parulkar et al.

(10) Patent No.: US 6,658,632 B1
(45) Date of Patent: Dec. 2, 2003

(54) BOUNDARY SCAN CELL ARCHITECTURE WITH COMPLETE SET OF OPERATIONAL MODES FOR HIGH PERFORMANCE INTEGRATED CIRCUITS

(75) Inventors: Ishwardutt Parulkar, San Francisco, CA (US); Sridhar Narayanan, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 344 days.

(21) Appl. No.: 09/594,656

(22) Filed: Jun. 15, 2000

(51) Int. Cl.[7] .............................................. G06F 17/50
(52) U.S. Cl. ............................................... 716/4; 716/1
(58) Field of Search ......................................... 716/1–14

(56) References Cited

U.S. PATENT DOCUMENTS

| | | | | |
|---|---|---|---|---|
| 5,281,864 A | * | 1/1994 | Hahn et al. ................... 326/37 |
| 5,450,415 A | | 9/1995 | Kamada ..................... 371/22.3 |
| 5,490,151 A | | 2/1996 | Feger et al. ................ 371/22.3 |
| 5,615,217 A | | 3/1997 | Horne et al. ............... 371/22.3 |
| 5,644,580 A | * | 7/1997 | Champlin ................... 714/733 |
| 5,805,197 A | * | 9/1998 | Fleming et al. ............. 347/237 |
| 5,831,866 A | * | 11/1998 | Burgun et al. .............. 714/725 |
| 6,108,807 A | * | 8/2000 | Ke ............................. 714/726 |
| 6,195,774 B1 | | 2/2001 | Jacobson .................... 714/727 |

* cited by examiner

Primary Examiner—Matthew Smith
Assistant Examiner—Sun James Lin
(74) Attorney, Agent, or Firm—Thelen Reid & Priest LLP; David B. Ritchie

(57) ABSTRACT

An electrical circuit includes a flip-flop, a first multiplexer, a second flip-flop, a third flip-flop, and output storage element including a second multiplexer and a fourth flip-flop. The first flip-flop, clocked functional clock signal, receives a functional signal. The first multiplexer receives the output of the first flip-flop and a test mode shift-in signal, and outputs one of them based on the state of a select input. The second flip-flop, clocked by a test clock signal, receives the output of the first multiplexer. The third flip-flop, clocked by a second test clock signal, receives the output of the second flip-flop. The second multiplexer receives the functional signal and the output of the third flip-flop, and outputs one of them based on a mode select input signal. The fourth flip-flop, clocked by a pulse-controlled functional clock signal, receives the output of the second multiplexer.

21 Claims, 6 Drawing Sheets

BOUNDARY SCAN CELL ARCHITECTURE WITH COMPLETE SET OF OPERATIONAL MODES FOR HIGH PERFORMANCE INTEGRATED CIRCUITS

BACKGROUND OF THE INVENTION

1. Field of the Invention

The present invention relates to high performance integrated circuits ("ICs") and, more particularly, to boundary scan cells implemented at output and bi-directional pins of ICs, without impacting the performance of the ICs, to facilitate testing of the ICs and their interconnections on printed circuit boards.

2. The Background Art

As is known to those skilled in the art, boundary scan is a collection of design rules applied to an integrated circuit ("IC") that enables testing and debugging at the IC level, at the printed circuit board level, and at the module or system level. The design rules for Boundary Scan are imposed by IEEE/ANSI Standard IEEE 1149.1-1990, which is accepted throughout the industry. The IEEE 1149.1-1990 Standard Test Access Port and Boundary Scan Architecture define the functionality and design guidelines for boundary scan cells. Within these guidelines, IC designers are free to implement the boundary scan logic and circuits in accordance with the design requirements and objectives of each particular IC.

FIG. 1 is a high-level block diagram illustrating an exemplary IC 100 incorporating Boundary Scan testing capabilities in accordance with the IEEE-1149-1990 standard. As shown in FIG. 1, IC 100 includes a plurality of input pins 105, a plurality of output pins 110, and application logic section 120. I/O pins may be substituted for any of pins 105, 110 and three-state pins may be substituted for-output pins 110, but these are omitted in FIG. 2 for clarity. Any number of input and/or output pins 105 and/or 110 may be included in IC 100.

Still referring to FIG. 1, for the purposes of Boundary Scan testing, circuitry necessary to implement normal IC functionality is deemed to reside within application logic section 120. In other words, application logic section 120 performs the normal (i.e., non-boundary scan testing) functions performed by IC 100. Naturally, the precise configuration or nature of application logic 120 varies according to the requirements of each IC.

Boundary Scan Cells ("BSCs") 200 selectively couple and isolate application logic section 120 from input pins 105 and output pins 110. Typically, each BSC 200 that is used with an input pin 105 couples between an input pin 105 and application logic 120. Similarly, each BSC 200 that is used with an output pin 110 couples between application logic 120 and an output pin 110. Not all of the pins of IC 100 are required to be associated with a BSC 200. For example, power pins and pins providing bus request signals may omit an association with a BSC 200.

Each BSC 200 receives a common MODE input signal. In addition, each BSC 200 couples to other BSCs 200 in a serial manner, such that all of the BSCs 200 collectively form Boundary Scan Register 140. A test data input ("TDI") input pin 130 drives the input of Boundary Scan Register 140. The last BSC 200 in Boundary Scan Register 140 couples to a test data output ("TDO") output pin 150. A boundary scan chain (not shown) is formed from series connections between all Boundary Scan Registers 140 of the ICs included on a printed circuit board.

As described so far, BSCs 200 and application logic 120 represent conventional BSCs and application logic sections. Furthermore, in accordance with the IEEE 1149.1-1990 standard, IC 100 includes a test access port ("TAP") controller 155, a state decoder (not shown in FIG. 1), instruction register 165, and instruction register decoder 170 similar or identical to those known in the art. As is also known in the art, IC 100 may include other data registers 175, such as an Identification ("ID") register (which uses an IC identification code), bypass register, and the like.

Instruction register 165 and other registers 175 couple in parallel across the input and output of Boundary Scan Register 140. Registers 165 and 175 represent shift registers receiving input data from TDI pin 130 and supplying output data through TDO pin 150. Parallel outputs from instruction register 165 couple to inputs of instruction register decoder 170. Thus, instruction register decoder 170 determines which Boundary Scan testing instruction is currently active for IC 100, and which data register is to be selected to be connected between TDI and TDO (and thus controls the select inputs of multiplexer 160 shown in FIG. 1).

The Test Mode Select ("TMS") and Test Clock ("TCK") signals are applied at TMS and TCK pins 180 and 185, respectively. Pins 180 and 185 couple to TAP controller 155 and couple in parallel among the various ICs 100 included in a board-level or higher-level system (not shown). As is known in the art, the TMS and TCK signals are typically generated by an external Boundary Scan master (not shown). TAP controller 155 represents a state machine sequencing between various states in response to the TMS signal logic level when clocked by the TCK signal, and produces various signals (to be described in more detail below) depending on the states and state transitions executed by TAP controller 155. The IEEE 1149.1-1990 test bus uses both clock edges of TCK. TMS and TDI are sampled on the rising edge of TCK, while TDO changes on the falling edge of TCK.

The state of the TMS signal presenting at pin 180 when clocked by the TCK signal controls the sequencing of TAP controller 155 through its various states. These states and their transitions are defined in the IEEE- 1149.1-1990 standard, and well-known to those of ordinary skill in the art. They are not discussed in further detail herein so as not to overcomplicate the present description. For more, information, the official IEEE-1149.1-1990 standard may be consulted. Specific TAP controller 155 states and their corresponding output signals are -discussed throughout this document where appropriate.

The TAP is controlled by the Test Clock ("TCK") and Test Mode Select ("TMS") inputs. These two inputs determine the TAP controller state transitions, which in turn determine whether an Instruction Register scan or Data Register scan is performed. The TAP controller is driven by the TCK input, and responds to the TMS input in accordance to a state diagram that is well known to those skilled in the art.

FIG. 2 is a block diagram illustrating mode selection logic 190 operating in conjunction with two BSCs, specifically illustrating one BSC 200 associated with an input pin 105 and one BSC 200 associated with an output pin 110. For a given BSC 200, one data input of multiplexer ("MUX") 204 may receive a system signal via input pin 105 (in the case of an input BSC) or application logic 120 (in the case of an output BSC). The other data input of multiplexer 204 may receive serial data from a previous BSC, or from TDI pin 130 (in the case of the first BSC in an IC). The selection input of MUX 204 may be driven by a signal from the state decoder (not shown in FIG. 1) indicating that TAP controller 155 (from FIG. 1) is operating in the Shift-DR state, as is known to those skilled in the art. Polarities may be arranged such that serial data from the direction of TDI pin 130 is presented at the output of multiplexer 204 during the Shift-DR state, whereas the system signal is presented at the output of multiplexer 204 during all other states.

The output of multiplexer 204 may drive a data input of capture flip-flop ("CAP FF.") 206. As is known to those skilled in the art, capture flip-flop 206 may receive a clock signal with timing equivalent to the TCK signal 185 (from FIG. 1) when TAP controller 155 (from FIG. 1) is operating in the data register (DR) states, and is clocked by the Clock-DR signal. While shifting data through a boundary scan chain, capture flip-flop 206 connects in a serial chain and serves as part of Boundary Scan Register 140 (FIG. 1).

The output of capture flip-flop 206 couples to a data input of an update flip-flop ("UPD FF") 208. As is known to those skilled in the art, update flip-flop 208 receives a clock signal at the end of the Update-DR TAP controller state. Accordingly, a double in buffering scheme is implemented, and the contents of capture flip-flop 206 are transferred to update flip-flop 208 during the Update-DR state.

The output of update flip-flop 208 may couple to a first data input of multiplexer ("MUX") 202. A second data input of multiplexer 202 receives a signal from the system via input pin 105 (in the case of an input BSC) or application logic 120 (in the case of an output BSC). An output of multiplexer 202 provides a signal to normal functional circuitry of the IC (i.e., application logic 120 or output pin 110), depending on the placement of each BSC 200. The MODE signal drives a selection input of multiplexer 202. Thus, when the MODE signal indicates that the IC is operating in the boundary scan test mode, the output of update flip-flop 208 appears at the output of multiplexer 202, and the Boundary-Scan register 140 thus affects the functionality of the IC. On the other hand, when the MODE signal indicates that the IC is operating in a functional (i.e., non-test) mode, the normal functional signal available from input pin 105 or from application logic 120 appears at the output of multiplexer 202, and the Boundary Scan circuit elements do not affect the normal functionality of the IC.

The MODE signal defines whether pins 105, 110 are isolated from or coupled to application logic 120. Mode selection logic 190 receives inputs from the instruction register decoder 170 (from FIG. 1), and from the state decoder in TAP controller 155 (from FIG. 1). These inputs are logically combined by mode selection logic 190 in a manner that is well-known to those of ordinary skill in the art to cause the MODE signal to indicate IC operation in either the boundary scan test mode or the normal functional mode as appropriate. A detailed discussion of mode selection logic 190 is not necessary in the context of the present invention, and is not provided herein so as not to overcomplicate the present disclosure. For more information, the official IEEE-1149.1-1990 standard may be consulted.

As will be described in more detail in subsequent sections of this document, the IEEE 1149.1-1990 standard defines three types of test operations that involve boundary scan cells: a sample/preload test operation ("SAMPLE/PRELOAD"), an external test ("EXTEST") and an internal test ("INTEST"). SAMPLE is a required test mode for the IEEE 1149.1-1990 standard. During SAMPLE, the IC is in normal operation (i.e., IC's application logic is coupled to the output buffers via a multiplexer 202 as shown in FIG. 2), while multiplexer 204 and capture flip-flop 206 are operated to capture and shift out normal IC output data. EXTEST is another required test mode for the IEEE 1149.1-1990 standard. During EXTEST, output boundary scan cells are used to drive test data from IC outputs onto wiring interconnects, and input boundary scan cells are used to capture test data driven from wiring interconnects onto IC inputs. In this way, EXTEST can be used to test wiring interconnects between IC inputs and outputs on a board. Referring now to FIG. 2, when performing an EXTEST instruction, capture flip-flop 206 for BSC 200 associated with input pin 105 captures the signal present at pin 105 and updates flip-flop 208 associated with output pin 110, driving test data onto output pin 110.

INTEST is an optional test mode for the IEEE 1149.1-1990 standard. During INTEST, input boundary scan cells are used to drive test data to the IC's application logic, and output boundary scan cells are used to capture the response from the application logic. In this way, INTEST can be used to test IC application logic in a "single-step" manner. It should be noted that although the INTEST instruction is optional, it is very useful in testing complex ICs such as microprocessors. Referring to FIG. 2, when performing an INTEST instruction, update flip-flop 208 associated with input pin 105 drives test data to application logic 120, and capture flip-flop 206 for BSC 200 associated with output pin 110 captures a signal generated by application logic 120.

As shown in the simplified model illustrated in FIG. 3, a boundary scan cell 200 has two signal paths: the normal functional logic path (from PARALLEL IN to PARALLEL OUT) and the boundary scan logic path (from SHIFT IN to SHIFT OUT). A more detailed model of a boundary scan cell 200 in an output or bi-directional pin configuration is illustrated in FIG. 4. As shown in FIG. 4, the normal functional logic path couples the PARALLEL IN signal to the PARALLEL OUT signal. The PARALLEL IN signal generally corresponds to the output of a functional flip-flop 122 within the application logic 120 of the IC. Functional flip-flop 122 is generally clocked by a functional clock ("F-CLK") of the IC.

Still referring to FIG. 4, multiplexer 202 is presented in the functional signal path between PARALLEL IN and PARALLEL OUT to enable boundary scan functionality. As is well known to those skilled in the art, the presence of multiplexer 202 into the functional logic path causes an undesirable additional signal delay through the functional signal path. This delay is especially significant in high performance ICs such as microprocessors. As will be described in more detail in subsequent sections of this document, aspects of the present invention provide a reduction in this undesirable delay, while maintaining complete boundary scan functionality.

Still referring to FIG. 4, the boundary scan logic path 210 comprises multiplexer 204, capture flip-flop 206, and update flip-flop 208. As mentioned earlier, one data input of multiplexer ("MUX") 204 receives the PARALLEL IN signal, which typically comes from application logic 120 (shown in FIGS. 1 and 2). The other data input of multiplexer 204 receives serial data through the SHIFT IN signal, which comes from the previous boundary scan cell (or from the TDI pin, in the case of the first BSC in a device). The selection input of multiplexer 204 is driven by the Shift-DR signal, as mentioned earlier, such that the SHIFT IN signal is presented at the output of multiplexer 204 during the Shift-DR state, whereas the PARALLEL IN signal is presented at the output of multiplexer 204 during all other states.

The output of multiplexer 204 drives the data input port of capture flip-flop 206. As mentioned earlier, capture flip-flop 206 is clocked by the CLOCK-DR signal. This signal is asserted when TAP controller 155 (from FIG. 1) enters certain operating states, in a manner well known to those skilled in the art. The output of capture flip-flop 206 couples to the data input port of update flip-flop 208. Update flip-flop 208 receives a clock signal at the end of the Update-DR TAP controller state. The output of update flip-flop 208 is presented to one data input of multiplexer 202, while the second data input of multiplexer 202 receives a signal from the PARALLEL IN signal. The output of multiplexer 202 provides a signal to an output pin 110. The MODE signal drives the selection input of multiplexer 202 in the manner described earlier. Thus, when the MODE signal indicates that the IC is operating in a boundary scan test mode, the output of update flip-flop 208 appears at the output of multiplexer 202, and when the MODE signal indicates that the IC is operating in a non-test mode (i.e., in a normal functional mode), the PARALLEL IN system signal from application logic 120 appears at the output of multiplexer 202.

As shown in FIG. 5, by using a storage element 302 as the last logic element just before the output pin 110, the speed of the functional path in Boundary Scan Cell 300 can be improved significantly. The storage element 302 comprises a multiplexer 304 followed by a flip-flop 404. The multiplexing of the functional path and the boundary scan is performed at the data input of storage element 302 by multiplexer 304, while synchronous registering with the normal functional clock ("F-CLK") is performed by flip-flop 404.

The addition of storage element 302 reduces the signal propagation time from the output of the last register stage in the functional path to the corresponding output pin of the IC (also known as the "Q to pin" delay time). As those of ordinary skill in the art will recognize, this reduction in signal propagation time produces a performance advantage, because it facilitates the use of faster functional clock frequencies in the IC.

However, although the boundary scan cell structure illustrated in FIG. 5 exhibits improved performance as a result of the introduction of storage element 302, the data at the output of storage element 302 is shifted by one clock cycle with respect to the data seen by the capture stage of the boundary scan cell (i.e., with respect to the output of Capture flip-flop 206). This clock shift violates the SAMPLE operational mode of the IEEE 1149.1-1990 boundary scan standard. As is known to those skilled in the art, in the SAMPLE mode, a "snap-shot" of the I/O pin activity in the boundary scan chain is taken. Similarly, the INTEST operational mode is also violated because in the INTEST boundary scan mode, the boundary scan cells corresponding to the output pins must capture the same state as the output pins in normal function. Finally, in the EXTEST boundary scan mode, the data in the Boundary Scan Register cells at the output pins must be able to be applied to the output pins in the same clock cycle that the update flip-flop 208 latches data. Because of the presence of flip-flop 404 within storage element 302, as shown in FIG. 5, test data cannot be applied to output pins in the same clock cycle that update flip-flop 208 is latched, and EXTEST is thereby violated.

Therefore, it would be desirable to provide the improved performance of the boundary scan cell architecture shown in FIG. 5, while also maintaining compatibility with the IEEE 1149.1-1990 boundary scan testing standard, and supporting all boundary scan test operational modes. The present invention addresses these problems. These and other features and advantages of the present invention will be presented in more detail in the following specification of the invention and in the associated figures.

SUMMARY OF THE INVENTION

A high-speed I/O boundary scan cell can be designed for output pins (as well as for the output and enable portions of bi-directional pins) by re-arranging the conventional location of the functional storage element and the multiplexing stage required for boundary scan. To gain this performance advantage, functional data is latched in a storage element after multiplexing with boundary scan data. This storage element then feeds the output pin directly. As a result, the data seen by the output pin is shifted by one clock cycle with respect to the data seen by the capture stage of the boundary scan cell. This configuration violates the SAMPLE operational mode of boundary scan, which is intended to take a snap shot of the I/O pin activity in the boundary scan chain. Similarly, in the INTEST boundary scan mode, the boundary scan cells corresponding to the output pins must capture the same state as the output pins during normal mode. Finally, in the EXTEST boundary scan mode, the data in the Boundary Scan Register cells of output pins must be able to be applied to the output pins in the same clock cycle that the data is latched into the Boundary Scan Register. According to aspects of the present invention, these operational modes are supported by the inclusion of an additional flip-flop stage in the boundary scan path and by controlling the behavior of the storage elements feeding the output pin. This functionally redundant flip-flop register maintains clock cycle synchronicity between data at the output pin and the data sampled by the boundary scan register during SAMPLE and INTEST. The extra logic is not on the functional path, and hence does not impact the performance of the high-speed I/O cell. By controlling the storage element feeding the output pin to be transparent while in the boundary scan test mode, the test data in the Boundary Scan Register can be directly applied to the output pin. This feature complies with the requirements of the EXTEST instruction. As a result of the proposed architecture, high-speed I/O cells compliant with all mandatory boundary scan operational modes can be designed.

BRIEF DESCRIPTION OF THE DRAWINGS

The accompanying drawings, which are incorporated in and constitute a part of this specification, illustrate an embodiment of the invention and, together with the present description, serve to explain the principles of the invention.

In the drawings.

DETAILED DESCRIPTION

One embodiment of the present invention is described herein in the context of an improved boundary scan cell architecture. Those of ordinary skill in the art will realize that the following description of the present invention is illustrative only and not in any way limiting. Other embodiments of the invention will readily suggest themselves to such skilled persons having the benefit of this disclosure.

Reference will now be made in detail to an implementation of the present invention as illustrated in the accompanying drawings. The same reference numbers will be used throughout the drawings and the following description to refer to the same or like parts.

In the context of the present invention, the following definitions apply. In addition to the terms explicitly defined below, other terms in appearing in the appended claims should be construed consistently with their usage throughout this specification with the use of such terms by those skilled in the art.

To "capture" means to load a value into a data register or an instruction register as a consequence of entry into the Capture-DR or Capture-IR TAP controller state, respectively.

A "clock" is a signal where transitions between the low and high logic level (or vice-versa) are used to indicate when a stored-state device, such as a flip-flop or latch, may perform an operation.

A "pin" is the point at which a connection is made between the integrated circuit and the substrate on which it is mounted (e.g., the printed circuit board). For packaged components, this would typically be the package pin; for components mounted directly in the substrate, this would typically be the bonding pad.

An "output pin" is a component that drives signals onto external connections.

A "scan design" is a design technique that introduces shift-register paths into digital electronic circuits and thereby improves their testability.

A "scan path" is the shift-register path through a circuit designed using the scan design technique.

To "update" means to transfer a logic value from the shift-register stage of a data register cell or an instruction register cell into the latched parallel output stage of the cell as a consequence of entry into the Update-DR or Update-IR controller state, respectively.

Figure 1:
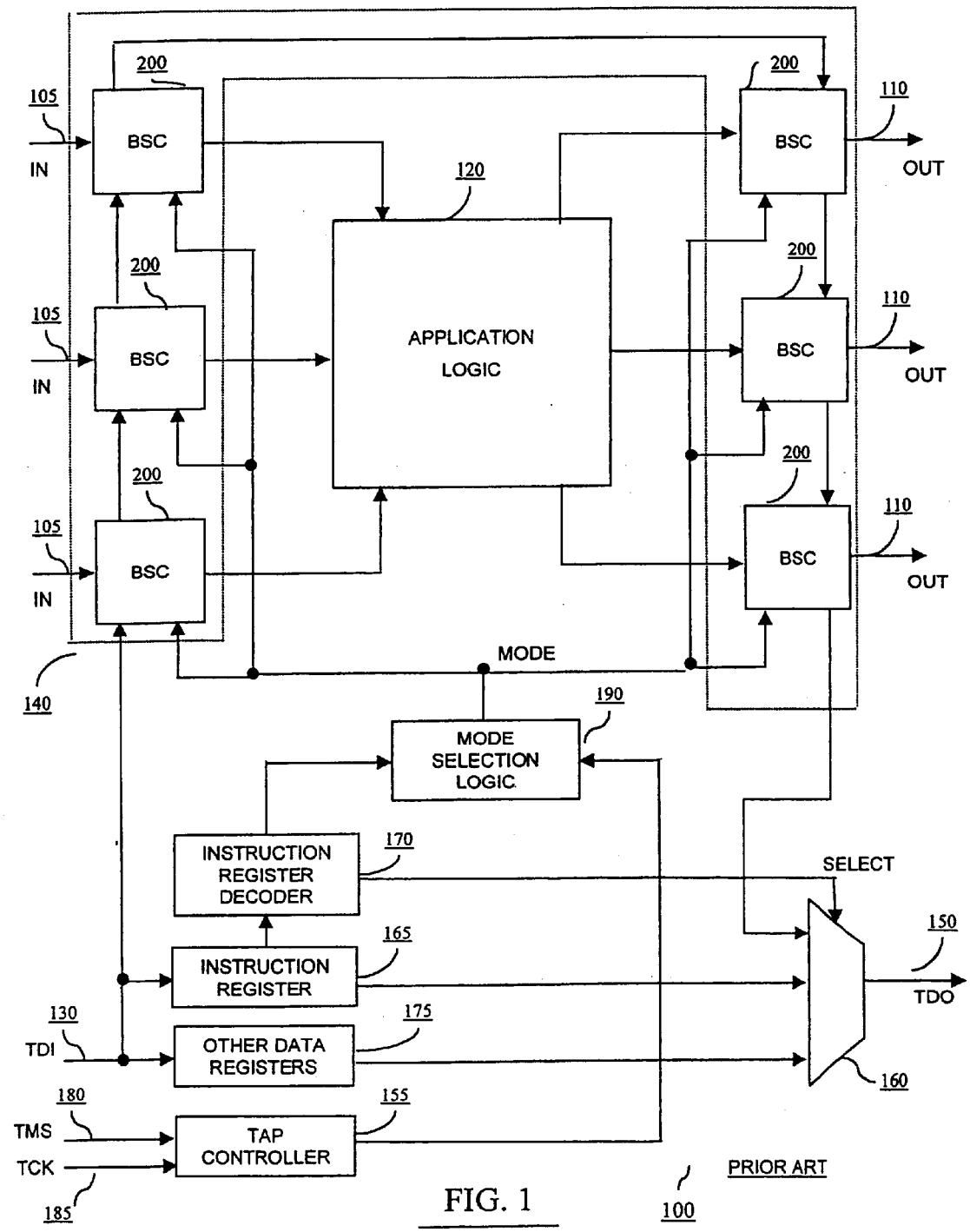
FIG. 1 depicts a block diagram of an exemplary integrated circuit ("IC") having boundary scan testing capabilities.
Figure 2:
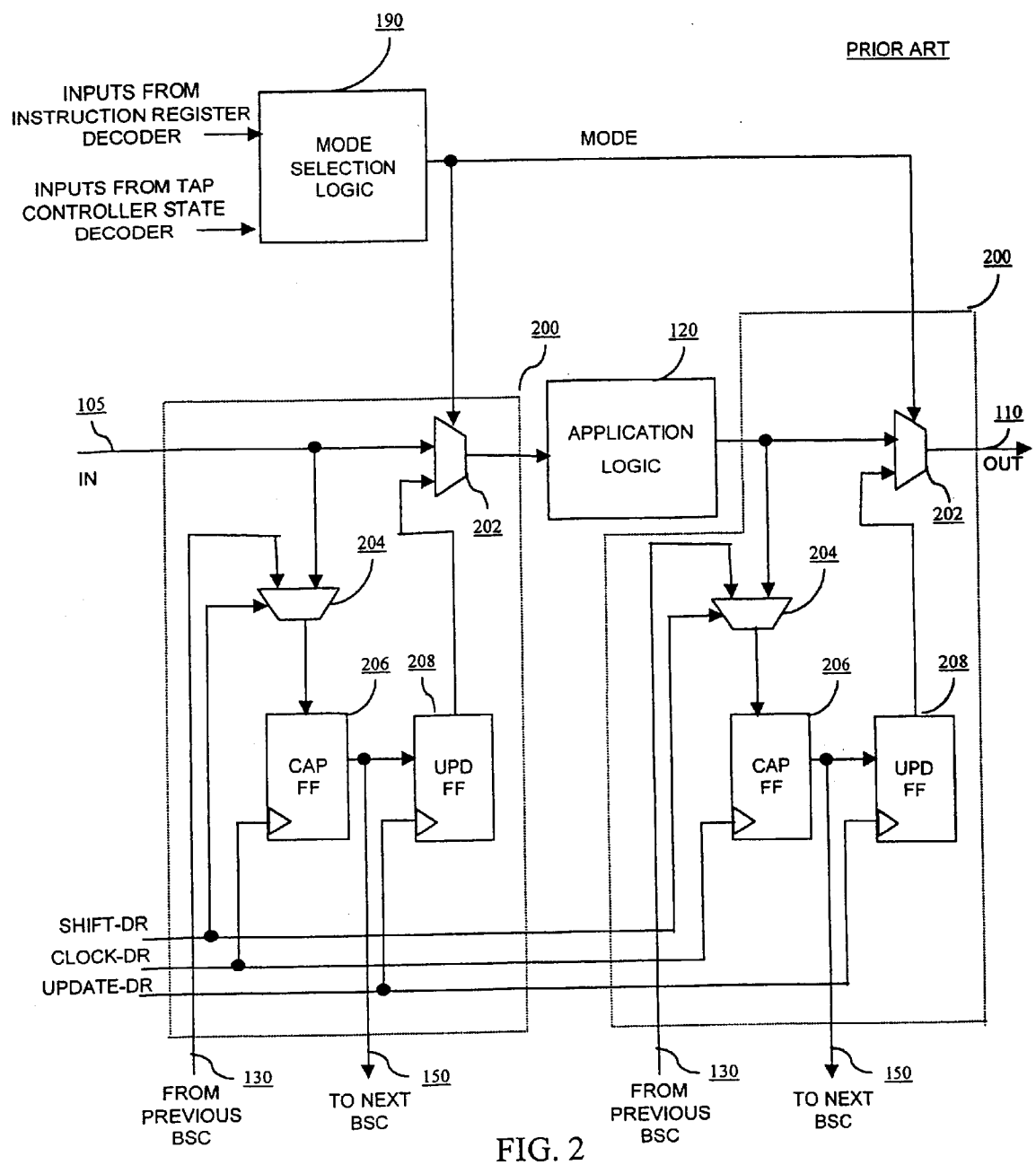
FIG. 2 is a block diagram illustrating mode selection logic and boundary scan cells associated with integrated circuit input and output pins.
Figure 3:
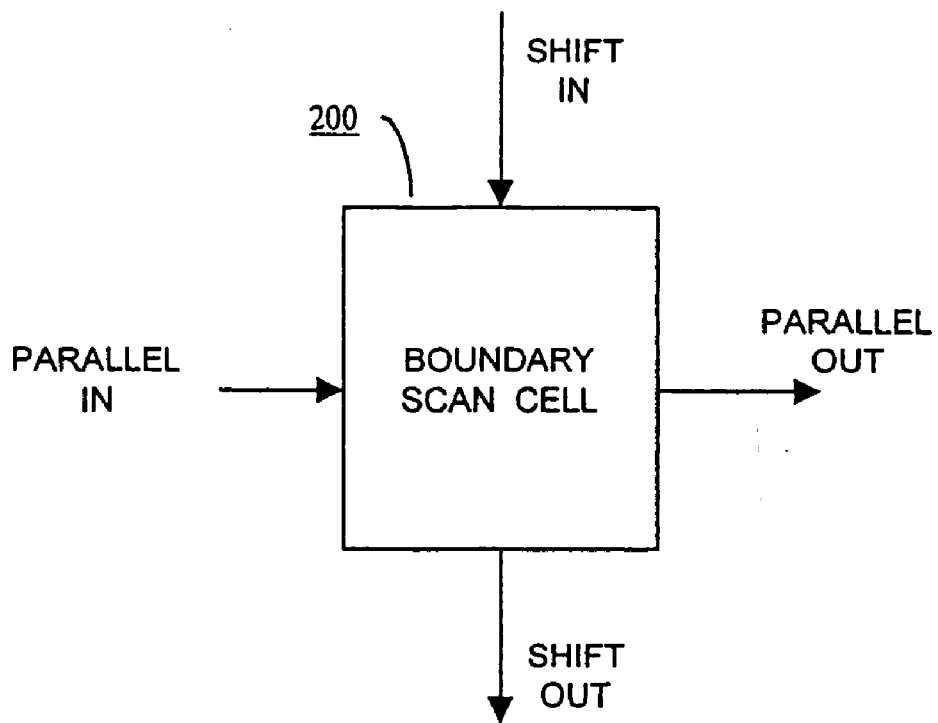
FIG. 3 is a block diagram illustrating signal flow model through a boundary scan cell.
Figure 4:
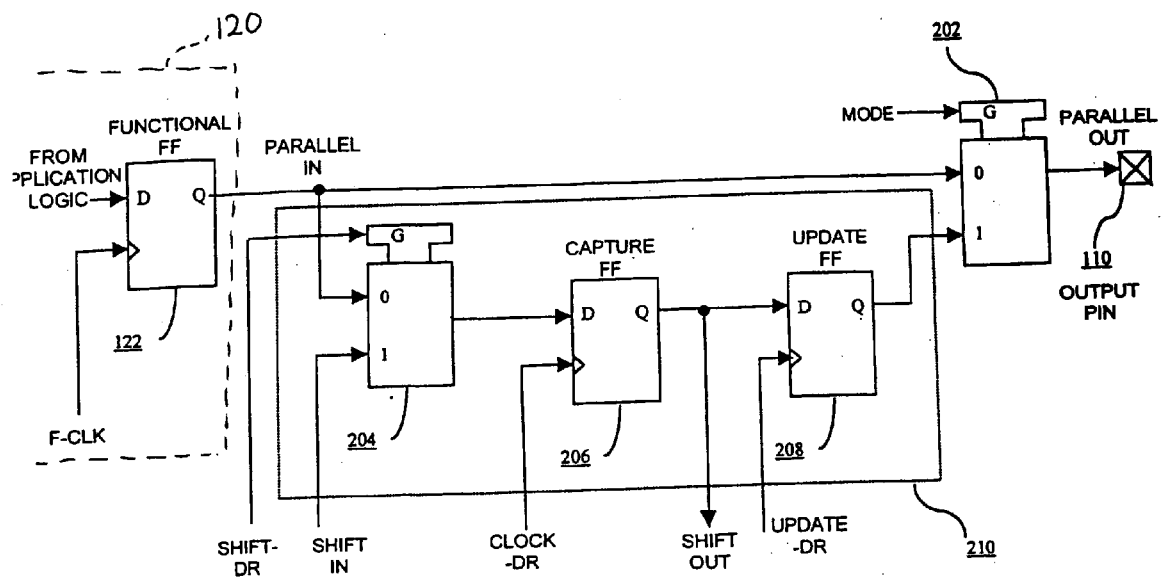
FIG. 4 is a block diagram illustrating a typical boundary scan cell structure for an output pin.

The IEEE 1149.1 standard requires two Data Registers: Boundary-Scan Register and Bypass Register. There is also a third, optional, Device Identification Register. If so desired for a particular implementation, additional user-defined Data Registers may be included. The Data Registers are arranged in parallel from the primary TDI input to the primary TDO output. The Instruction Register supplies the address that allows one of the Data Registers to be accessed during a Data Register scan operation. During a Data Register scan operation, the addressed scan register receives TAP control via the Data Register shift enable (Shift-DR) and Data Register clock (Clock-DR) inputs to preload test response and shift data from TDI to TDO. During a Data Register scan operation, the SELECT output from the TAP controller selects the output of the Data Register to drive the TDO pin. When one scan path in the Data Register is being accessed, all other scan paths remain in their present state. As mentioned earlier, the Boundary-Scan register 140 (shown in FIG. 1) consists of a series of boundary-scan cells ("BSCs") arranged to form a scan path around the boundary of the host IC. The BSCs provide the controllability and observability features required to perform boundary-scan testing. The Bypass Register and Device ID registers are described in the IEEE 1149.1-1990 standard, and are not described in further detail herein so as not to overcomplicate the present disclosure, since they do not pertain to the present invention.

The IEEE 1149.1-1990 standard defines nine test instructions. Of the nine instructions, three are required and six are optional. Two of the required test instructions (i.e., SAMPLE/PRELOAD, and EXTEST), as well as the optional INTEST instruction, are described in more detail below, to the extent that they pertain to the present invention.

The required SAMPLE/PRELOAD instruction allows the IC to remain in its functional mode, and selects the Boundary-Scan Register to be coupled between TDI and TDO. During this instruction, the Boundary-Scan Register can be accessed via a data scan operation, to take a sample of the functional data entering and leaving the IC. This instruction is also used to preload test data into the Boundary-Scan Register prior to loading an EXTEST instruction. The bit code for this instruction is defined by the user.

The optional INTEST instruction is one of two instructions defined by the IEEE 1149.1-1990 standard that allow testing of the on-chip system logic. Using the INTEST instruction, test stimuli are shifted in one at a time and applied to the on-chip system logic. This process is also known as "single-stepping" by those of ordinary skill in the art. In the single-stepping test mode, test results are captured into the boundary-scan register and are examined by subsequent shifting. Typically, data would be loaded onto the latched parallel outputs of boundary-scan shift-register stages using the SAMPLE/PRELOAD instruction prior to selection of the INTEST instruction.

The INTEST instruction thus allows static (i.e., slow speed) testing of the on-chip system logic, with each test pattern and response being shifted through the boundary-scan register. As mentioned above, the INTEST instruction requires that the on-chip system logic can be operated in a single-step mode, where the circuitry moves one step forward in its operation each time that shifting of the boundary-scan register is completed.

The other instruction defined in the IEEE 1149.1-1990 standard that facilitates testing of the on-chip system logic is the EXTEST instruction. The required EXTEST instruction places the IC into an external boundary test mode and selects the Boundary-Scan Register to be coupled between TDI and TDO. During this instruction, the Boundary-Scan Register is accessed to drive test data off-chip via the boundary outputs and receive test data off-chip via the boundary inputs. The bit code of this instruction is defined by the IEEE 1149.1-1990 standard to be all zeros.

Figure 5:
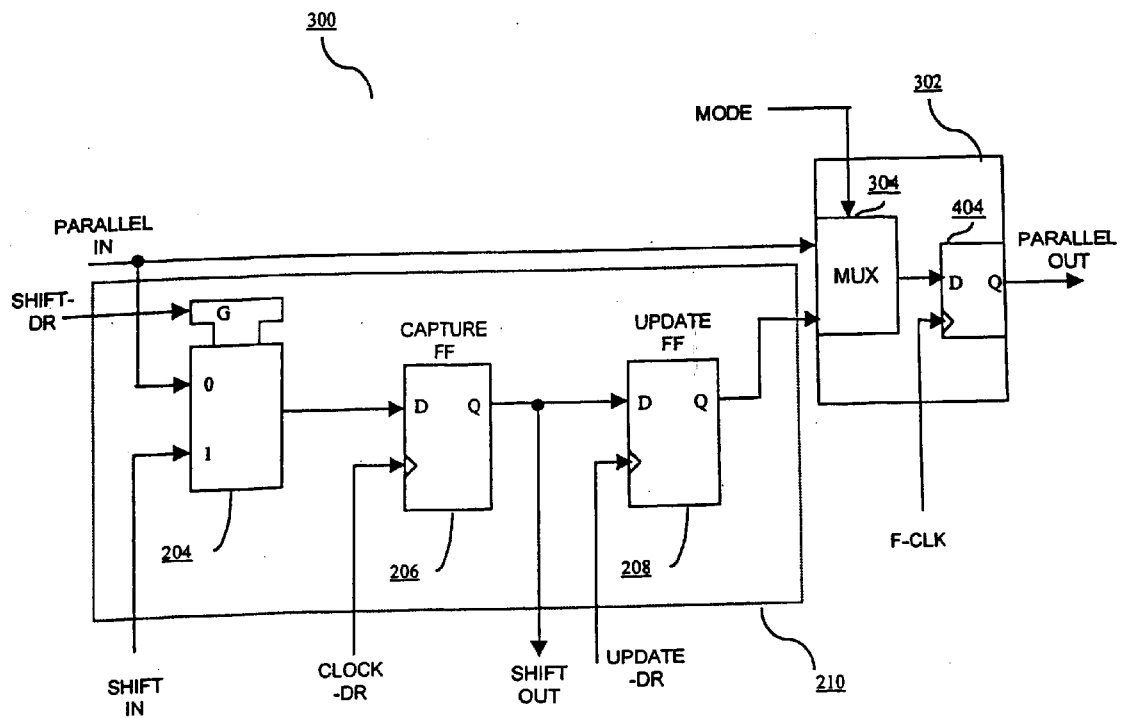
FIG. 5 is a block diagram illustrating a boundary scan cell structure having improved performance characteristics.
Figure 6:
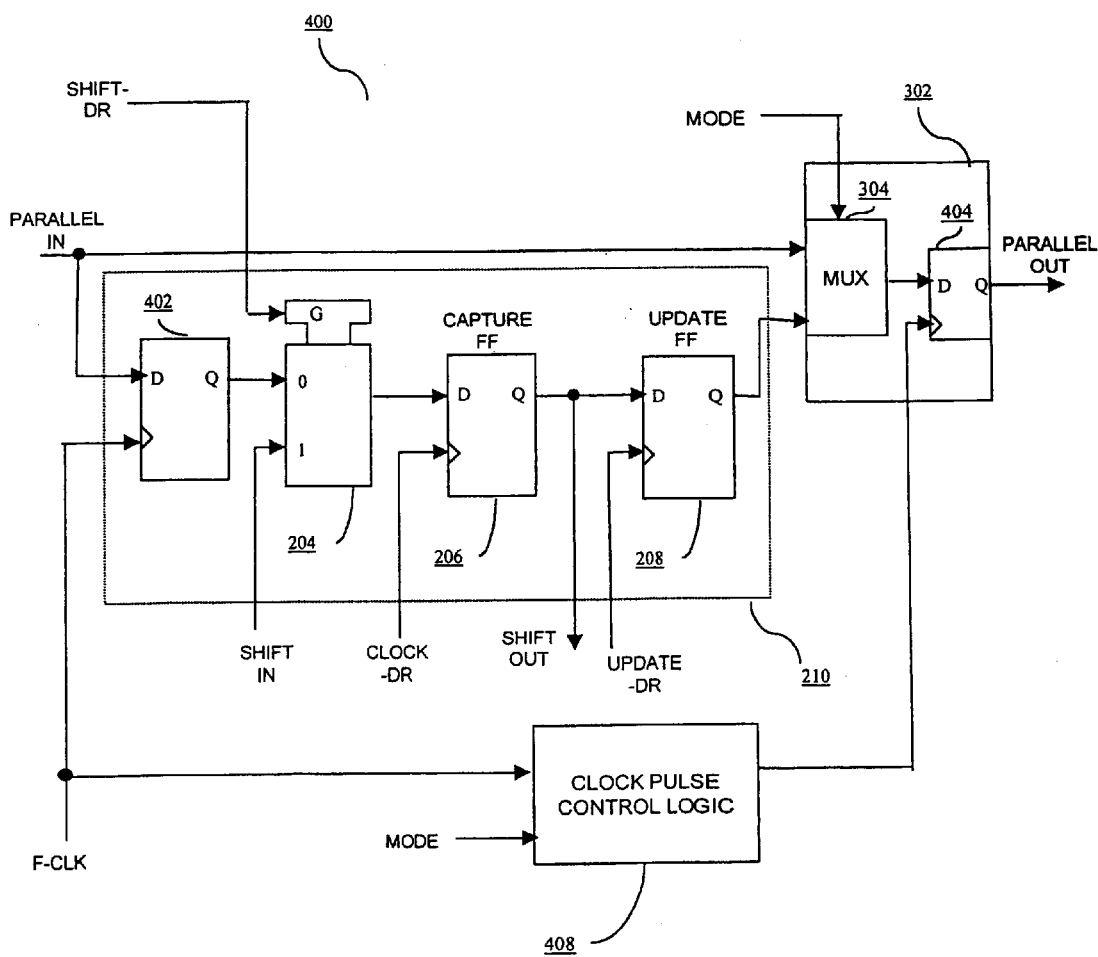
FIG. 6 is a block diagram illustrating a boundary scan cell structure having improved performance characteristics while maintaining boundary scan testing compatibility according to aspects of the present invention.

According to aspects of the present invention, the SAMPLE, INTEST, and EXTEST operational modes are supported by the inclusion of an additional flip-flop stage in the boundary scan path, shown as flip-flop 402 in FIG. 6, and by the inclusion of clock pulse control logic 408 to control the operation of flip-flop 404 shown in FIG. 6. The boundary scan cell 400 shown in FIG. 6 is similar to the improved boundary scan cell 300 shown in FIG. 5, except that flip-flop 402 and clock pulse control logic 408 have been added to boundary scan cell 400 of FIG. 6 according to aspects of the present invention. Flip-flop 402 is clocked by the same functional clock ("F-CLK") that is used to the output stage of storage element 302. Flip-flop 402, while functionally redundant, is of critical importance for maintaining clock cycle synchronicity between data at the PARALLEL OUT port and the data sampled by the boundary scan register (i.e., the output of capture flip-flop 206). It should be noted that the extra logic represented by flip-flop 402 is not on the functional path, and hence does not impact the performance of the high-speed boundary scan I/O cell 400.

The clock pulse control logic 408 is designed such that when the MODE signal indicates that the IC is operating in a boundary scan test mode, clock pulse control logic 408 commands flip-flop stage 404 of storage element 302 to function as a transparent latch. On the other hand, when the MODE signal indicates that the IC is operating in a normal non-test functional mode, clock pulse control logic 408 commands register stage 404 of storage element 302 to function as an edge-triggered flip-flop triggered by the rising edge of the "F-CLK" signal.

As a result of the proposed architecture, high-speed I/O cells compliant with all mandatory boundary scan operational modes can be designed. Specifically, the functionally redundant flip-flop 402 maintains clock cycle synchronicity between data at the output pin and the data sampled by the boundary scan register during SAMPLE and INTEST, and, by controlling the storage element 404 feeding the output pin to be transparent while in the boundary scan test mode, the test data in the Boundary Scan Register can be directly applied to the output pin to comply with the requirements of the EXTEST instruction.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. An electrical circuit, comprising:
   a first flip-flop having a data input configured to receive a functional signal generated by application logic, a clock input controlled by a functional clock signal, and an output configured to provide a first flip-flop output signal;
   a first multiplexer having a first input coupled the output of said first flip-flop, a second input configured to receive a test mode shift-in signal, an output, and a select input, wherein the state of said select input determines whether said first flip-flop output signal or said shift-in signal is presented at said output of said first multiplexer;
   a second flip-flop having a data input coupled to said output of said first multiplexer, a clock input controlled by a first test clock signal, and an output;
   a third flip-flop having a data input coupled to said output of said second flip-flop, a clock input controlled by a second test clock signal, and an output configured to provide a third flip-flop output signal; and
   an output storage element comprising a second multiplexer and a fourth flip-flop, said second multiplexer having a first input configured to receive said functional signal, a second input coupled to said output of said third flip-flop, an output, and a mode select input, wherein the state of said mode select input determines whether said functional signal or said third flip-flop) output signal is presented to the output of said second multiplexer, and said fourth flip-flop having a data input coupled to said output of said second multiplexer and a clock input controlled by said functional clock signal.

2. The electrical circuit according to claim 1, wherein said second test clock signal is inverted in polarity with respect to said first test clock signal.

3. An electrical circuit, comprising:
   a first flip-flop having a data input configured to receive a functional signal generated by application logic, a clock input controlled by a functional clock signal, and an output configured to provide a first flip-flop, output signal;
   a first multiplexer having a first input coupled the output of said first flip-flop, a second input coupled to a test mode shift-in signal, an output, and a select input, wherein the state of said select input determines whether said first flip-flop output signal or said shift-in signal is presented at said output of said first multiplexer;
   a second flip-flop having a data input coupled to said output of said first multiplexer, a clock input controlled by a first test clock signal, and an output;
   a third flip-flop having a data input coupled to said output of said second flip-flop, a clock input controlled by a second test clock signal, and an output configured to provide a third flip-flop output signal;
   a clock pulse control logic circuit having a first input coupled to said functional clock signal, a second input configured to receive a mode select input signal, and an output; and
   an output storage element comprising a second multiplexer and a fourth flip-flop, said second multiplexer having a first input configured to receive said functional signal, a second input coupled to said output of said third flip-flop, an output, and a mode select input configured to receive said mode select input signal, wherein a state of said mode select input signal determines whether said functional signal or said third flip-flop, output signal is presented to said output, and said fourth flip-flop having a data input coupled to said output of said second multiplexer and a clock input controlled by the output of said clock pulse control logic circuit.

4. The electrical circuit according to claim 3, wherein said second test clock signal is inverted in polarity with respect to said first test clock signal.

5. The electrical circuit according to claim 3, wherein the output of said clock pulse control signal commands said fourth flip-flop to function as a transparent latch if said mode select input signal indicates operation in a test mode and wherein the output of said clock pulse control signal commands said fourth flip-flop to function as an edge-triggered flip-flop if said mode select input signal indicates operation in a normal functional mode.

6. The electrical circuit according to claim 5, wherein said second test clock signal is inverted in polarity with respect to said first test clock signal.

7. The electrical circuit according to claim 3, wherein said second multiplexer couples said third flip-flop output signal from said third flip-flop to the data input of said fourth flip-flop if said mode select input signal indicates operation in a test mode.

8. A method for improving the performance of high-speed input/output cells in an integrated circuit while retaining compatibility with the operational modes of a boundary scan cell architecture, comprising:
   latching a functional signal with one edge of a functional clock generated by application logic to produce a latched functional signal;
   multiplexing said latched functional signal with a test mode shift-in signal, based on a state of a first select inputsignal, to produce a first multiplexed signal;

latching said first multiplexed signal with one edge of a first test clock signal to produce a latched first multiplexed signal;

latching said latched first multiplexed signal with one edge of a second test clock signal to produce a latched test mode signal;

multiplexing said functional signal with said latched test mode signal, based on a state of a mode select input signal, to produce a second multiplexed signal; and latching said second multiplexed signal with one edge of said functional clock signal to produce an output signal.

9. The method according to claim 8, wherein said second test clock signal is inverted in polarity with respect to said first test clock signal.

10. A method for improving the performance of high-speed input/output cells in an integrated circuit while retaining compatibility with the operational modes of a boundary scan cell architecture, comprising:

latching a functional signal with one edge of a functional clock generated by application logic to produce a latched functional signal;

multiplexing said latched functional signal with a test mode shift-in signal, based on a state of a first select input signal, to produce a first multiplexed signal;

latching said first multiplexed signal with one edge of a first test clock signal to produce a latched first multiplexed signal;

latching said latched first multiplexed signal with one edge of a second test clock signal to produce a latched test mode signal;

multiplexing said functional signal with said latched test mode signal, based on a state of a mode select input signal to produce a second multiplexed signal; and latching said second multiplexed signal with one edge of a pulsed functional clock signal to produce an output signal, said pulsed functional clock signal being generated based on said functional clock signal and on said mode select input signal.

11. The method according to claim 10, wherein said second test clock signal is inverted in polarity with respect to said first test clock signal.

12. The method according to claim 10, wherein said second multiplexed signal is configured to receive said latched test mode signal if said mode select input signal indicates operation in a test mode.

13. The method according to claim 12, wherein said second test clock signal is inverted in polarity with respect to said first test clock signal.

14. The method according to claim 10, wherein said pulsed functional clock signal controls said latching of said second multiplexed signal, to perform a transparent latch function if said mode select input signal indicates operation in a test mode, and to perform an edge-triggered flip-flop function if said mode select input signal indicates operation in a normal functional mode.

15. An apparatus for improving the performance of high-speed input/output cells in an integrated circuit while retaining compatibility with the operational modes of a boundary scan cell architecture, comprising:

means for latching a functional signal with one edge of a functional clock generated by application logic to produce a latched functional signal;

means for multiplexing said latched functional signal with a test mode shift-in signal, based on a state of a first select input signal, to produce a first multiplexed signal;

means for latching said first multiplexed signal with one edge of a first test clock signal to produce a latched first multiplexed signal;

means for latching said latched first multiplexed signal with one edge of a second test clock signal to produce a latched test mode signal;

means for multiplexing said functional signal with said latched test mode signal, based on a state of a mode select input signal, to produce a second multiplexed signal; and means for latching said second multiplexed signal with one edge of said functional clock signal to produce an output signal.

16. The apparatus according to claim 15, wherein said second test clock signal is inverted in polarity with respect to said first test clock signal.

17. An apparatus for improving the performance of high-speed input/output cells in an integrated circuit while retaining compatibility with the operational modes of a boundary scan cell architecture, comprising:

means for latching a functional signal with one edge of a functional clock generated by application logic to produce a latched functional signal;

means for multiplexing said latched functional signal with a test mode shift-in signal, based on a state of a first select input signal, to produce a first multiplexed signal;

means for latching said first multiplexed signal with one edge of a first test clock signal to produce a latched first multiplexed signal;

means for latching said latched first multiplexed signal with one edge of a second test clock signal to produce a latched test mode signal;

means for multiplexing said functional signal with said latched test mode signal, based on a state of a mode select input signal, to produce a second multiplexed signal; and means for latching said second multiplexed signal with one edge of a pulsed functional clock signal to produce an output signal, said pulsed functional clock signal being generated based on said functional clock signal and on said mode select signal.

18. The apparatus according to claim 17, wherein said second test clock signal is inverted in polarity with respect to said first test clock signal.

19. The apparatus according to claim 17, wherein said second multiplexed signal is configured to receive said latched test-mode signal if said mode select input signal indicates operation in a test mode.

20. The apparatus according to claim 14, wherein said second test clock signal is inverted in polarity with respect to said first test clock signal.

21. The apparatus according to claim 17, wherein said pulsed functional clock signal controls said means for latching said second multiplexed signal, to function as a transparent latch if said mode select input signal indicates operation in a test mode, and to function as an edge-triggered flip-flop if said mode select input signal indicates operation in a normal functional mode.

* * * * *